(12) United States Patent
Otsuki et al.

(10) Patent No.: US 7,499,280 B2
(45) Date of Patent: Mar. 3, 2009

(54) HEAT DISSIPATING DEVICE

(75) Inventors: Takaya Otsuki, Kyoto (JP); Naoto Yamaoka, Kyoto (JP)

(73) Assignee: Nidec Corporation, Kyoto (JP)

( * ) Notice: Subject to any disclaimer, the term of this patent is extended or adjusted under 35 U.S.C. 154(b) by 0 days.

(21) Appl. No.: 11/617,115

(22) Filed: Dec. 28, 2006

(65) Prior Publication Data
US 2007/0147002 A1     Jun. 28, 2007

(30) Foreign Application Priority Data
Dec. 28, 2005    (JP) .............................. 2005-380312

(51) Int. Cl.
*H05K 7/20* (2006.01)
*F28F 7/00* (2006.01)
*H01L 23/34* (2006.01)

(52) U.S. Cl. ..................... 361/704; 165/80.2; 165/80.3; 165/185; 165/121; 165/122; 257/718; 257/719; 361/695; 361/697; 361/719

(58) Field of Classification Search ........................ None
See application file for complete search history.

(56) References Cited

U.S. PATENT DOCUMENTS

| | | | | |
|---|---|---|---|---|
| 5,132,780 A | * | 7/1992 | Higgins, III ................. | 257/722 |
| 5,307,236 A | * | 4/1994 | Rio et al. ..................... | 361/720 |
| 6,386,274 B1 | * | 5/2002 | Wang et al. ................. | 165/80.3 |
| 6,390,181 B1 | * | 5/2002 | Hall et al. ................... | 165/80.3 |
| 6,691,768 B2 | * | 2/2004 | Hsieh et al. ................ | 165/80.3 |
| 6,831,836 B2 | * | 12/2004 | Bhatia et al. ................ | 361/705 |
| 6,883,593 B2 | * | 4/2005 | Johnson et al. ............. | 165/80.3 |
| 6,977,814 B2 | * | 12/2005 | Hornung ..................... | 361/690 |
| 6,985,359 B2 | * | 1/2006 | Delano et al. ............... | 361/704 |
| 7,269,013 B2 | * | 9/2007 | Chen et al. ................... | 361/700 |
| 2005/0068741 A1 | * | 3/2005 | Bailey et al. ................ | 361/719 |
| 2006/0082972 A1 | * | 4/2006 | Kim ........................... | 361/709 |
| 2006/0221576 A1 | * | 10/2006 | Takano et al. ............... | 361/719 |

* cited by examiner

*Primary Examiner*—Gregory D Thompson
(74) *Attorney, Agent, or Firm*—Keating & Bennett, LLP

(57) ABSTRACT

A heat dissipating device which dissipates heat generated by a heat generating object mounted on a base includes a heat sink body, a heat-conducting area, a tip portion, an inclined surface, and a fastener. The heat-conducting area includes the tip portion, which is a substantially middle portion of the heat-conducting area and is arranged substantially closest to the heat generating object among the other areas of the heat-conducting area, and the inclined surface which is a part of the heat-conducting area and inclines outwardly from the tip portion such that a distance between the inclined surface and the heat generating object gradually increases. The fastener includes an attaching portion to mount the heat dissipating device to the base, and the attaching portion is arranged substantially radially outside of an outer peripheral portion of the heat generating object. When the attaching portion is secured to the base, the tip portion of the heat-conducting area is pressed to the heat generating object.

21 Claims, 16 Drawing Sheets

HEAT DISSIPATING DEVICE

BACKGROUND OF THE INVENTION

1. Field of the Invention

The present invention generally relates to a heat dissipating device which dissipates heat generated by an electronic component (e.g., a microprocessing unit).

2. Background of the Related Art

With recent technological advances, a microprocessing unit (MPU) has a high speed. Such an MPU, however, generates considerable heat. Since an overheated MPU may malfunction, a technique for effectively dissipating the heat generated by the MPU is in great demand.

Generally, a heat dissipating device is arranged on the MPU of an electronic device to dissipate heat generated by the MPU. The heat dissipating device generally includes a heat sink having a plurality of heat sink fins and a cooling fan. The heat generated by the MPU is diffused to the plurality of heat sink fins of the heat sink, and a cooling fan provides air flow to the heat sink fins. Thereby, the heat is dissipated actively from the heat sink fins.

For effectively dissipating heat, it is preferable that the heat sink is retained in close contact with the MPU and has a wide heat-conducting area through which the heat is diffused from the MPU to the heat sink. However, it is difficult to arrange the heat sink and the MPU without a minor gap left therebetween. Generally, a bottom surface of the heat sink is pressed to the MPU, and a thermal conductive member (e.g., a thermal tape or thermal-conductive silicone grease) is arranged between the MPU and the heat sink to fill in the gap.

It is known that the thermal conductive member should be as thin as possible for effectively dissipating the heat. It is also generally known that the bottom surface of the heat sink that is pressed to the MPU preferably has a substantially flat surface.

SUMMARY OF THE INVENTION

According to various preferred embodiments of the present invention, a heat dissipating device which dissipates heat generated by a heat generating object mounted on a base includes a heat sink body, a plurality of heat sink fins, a heat-conducting area, a tip portion, an inclined surface, and a fastener. The plurality of heat sink fins is integral with the heat sink body. The heat-conducting area is a portion of the heat dissipating device which is pressed to a substantially flat surface of the heat generating object. The tip portion is a substantially middle portion of the heat-conducting area and is arranged substantially closest to the heat generating object among other areas of the heat-conducting area. The inclined surface is a portion of the heat-conducting area and inclines outwardly from the tip portion such that a distance between the inclined surface and the heat generating object gradually increases. The fastener includes an attaching portion arranged to mount the heat dissipating device to the base, and the attaching portion is arranged substantially radially outside of an outer peripheral portion of the heat generating object.

According to another preferred embodiment of the present invention, the vertical distance between the tip portion and a distal end portion of the heat-conducting area in the radial direction is about 200 μm or less.

According to yet another preferred embodiment of the present invention, the distance between the attaching portion and the base is greater than a distance between the tip portion and the heat generating object in a state when the heat dissipating device is placed on the heat generating object.

With the configurations mentioned above, when the attaching portion is secured to the base, moments of force pressing the tip portion to the heat generating object are generated. At the same time, the tip portion acts as a fulcrum, and the base and the heat generating object is bent. As a result, the heat generating object and the contact surface are arranged closely, and therefore, thermal resistance therebetween is lowered.

According to yet another preferred embodiment of the present invention, the heat dissipating device further includes a cooling fan. With the cooling fan providing air flow to the heat sink fins, the heat generated by the heat generating object is actively dissipated.

According to yet another preferred embodiment of the present invention, the heat-conducting area of the heat dissipating device is shaped by a cutting process. By shaping the heat-conducting area by cutting process, it is possible to process the heat-conducting area precisely into a desirable shape.

Other features, elements, advantages and characteristics of the present invention will become more apparent from the following detailed description of preferred embodiments thereof with reference to the attached drawings.

DETAILED DESCRIPTION OF PREFERRED EMBODIMENTS

Figure 1:
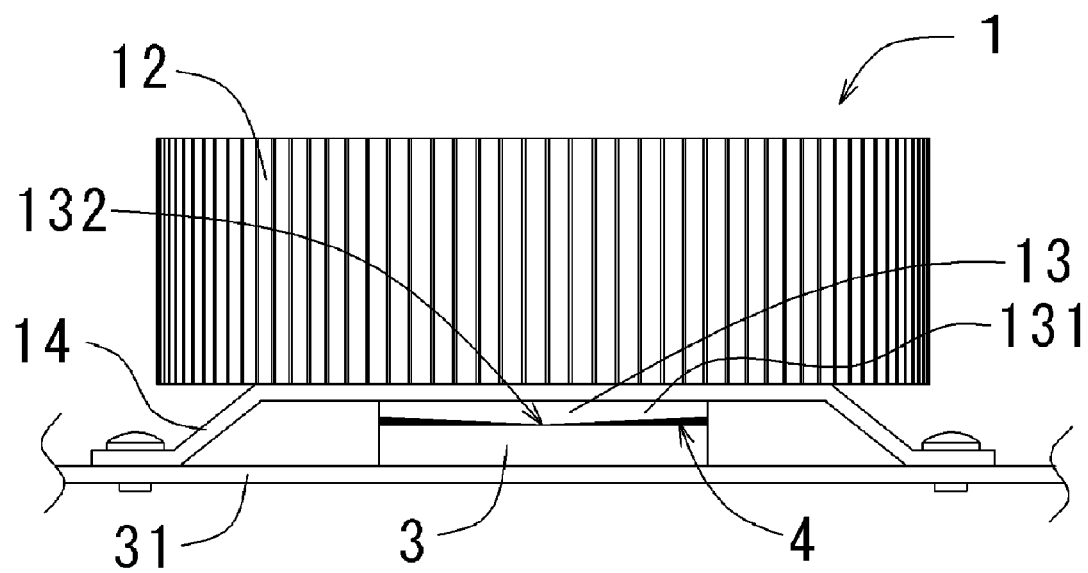
FIG. 1 is a side view illustrating a heat sink according to a first preferred embodiment of the present invention.

Referring to FIGS. 1 to 15, a heat dissipating device according to a first preferred embodiment of the present invention will be described in detail. It should be understood that in the explanation of the preferred embodiments of the present invention, when positional relationships among and orientations of the different components are described as being up/down or left/right, ultimate positional relationships and orientations that are in the drawings are indicated and positional relationships among and orientations of the components once having been assembled into an actual device are not indicated.

Figure 2:
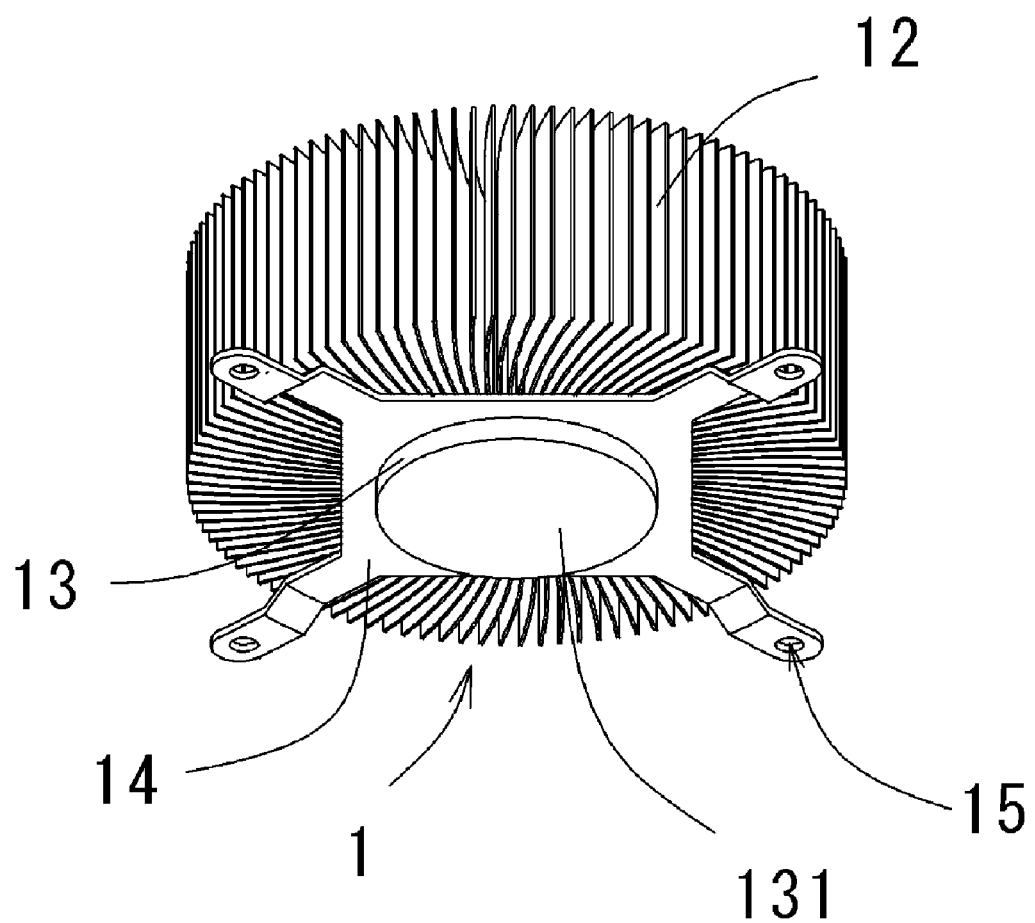
FIG. 2 is a perspective view illustrating the heat sink according to the first preferred embodiment of the present invention.
Figure 3:
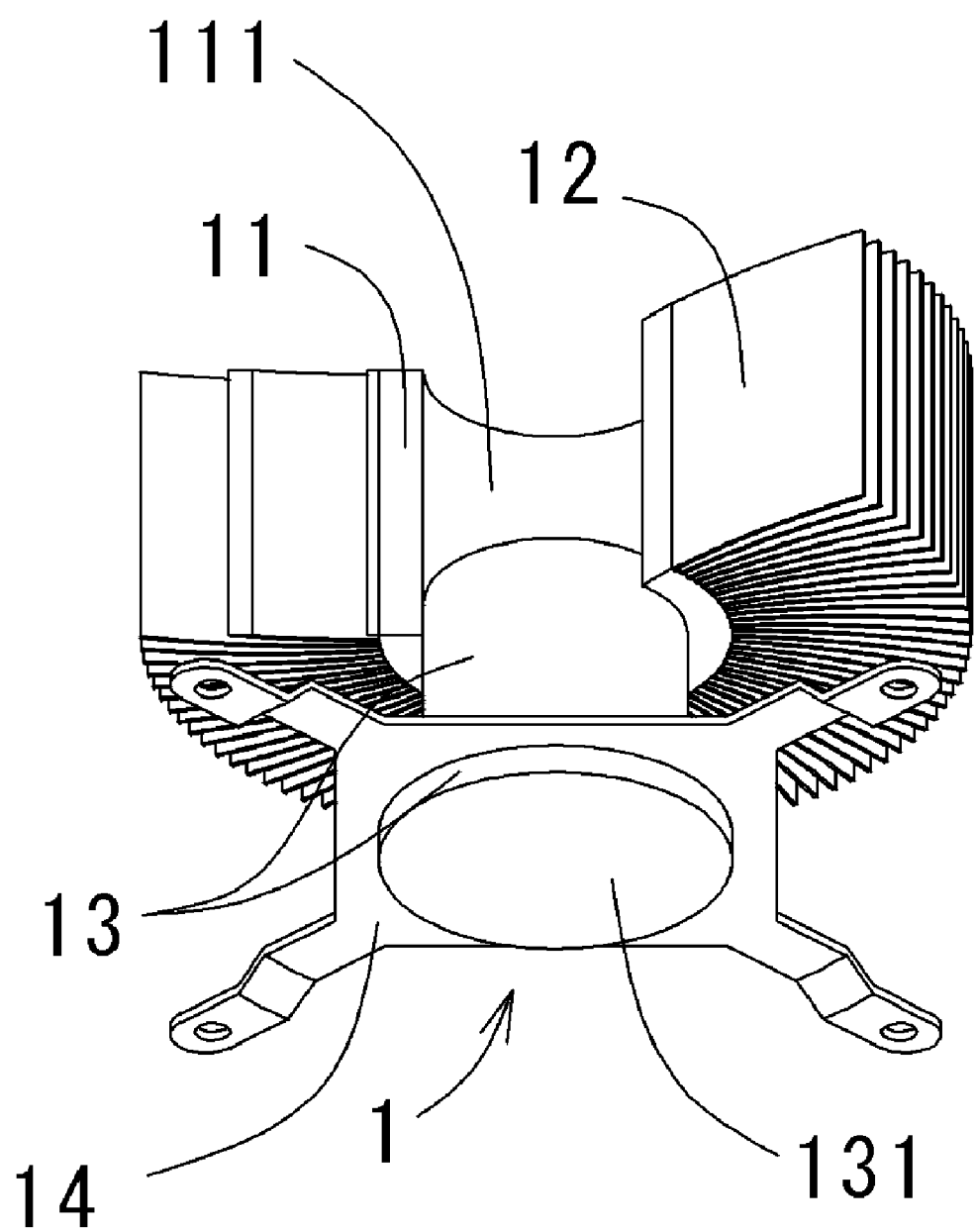
FIG. 3 is an exploded view illustrating a heat sink body and a core to be press-fitted into a through hole arranged on the heat sink body.

First Preferred Embodiment (1) Heat Dissipating Device Having Heat Sink Pressed Against MPU with Thermal Conductive Member Arranged Between Heat Sink and MPU Referring to FIGS. 1 to 3, a first preferred embodiment of the present invention will be described in detail. FIG. 1 is a side view illustrating a heat sink according to the first preferred embodiment of the present invention. FIG. 2 is a perspective view illustrating the heat sink according to the first preferred embodiment of the present invention. FIG. 3 is an exploded view illustrating the heat sink and a core to be press-fitted into a through hole arranged on the heat sink.

A heat sink 1 preferably includes a substantially cylindrical heat sink body 11 and a plurality of heat sink fins 12 protruding radially outwardly from the heat sink body 11 to widen a superficial area of the heat sink 1. The heat sink 1 is preferably made of a material with high thermal conductivity (e.g., aluminum, copper, and copper alloy). In the first preferred embodiment of the present invention, the heat sink body 11 and the heat sink fins 12 are preferably made of aluminum, for example. The plurality of heat sink fins 12 are arranged on an outer circumferential surface of the heat sink body 11, as shown in FIG. 2. The plurality of heat sink fins 12 may curve in a circumferential direction to further widen the superficial area. It should be noted, however, the shapes of the heat sink fins 12 are not limited to those described above, and a number of modifications may be made thereon.

As shown in FIG. 3, the heat sink body 11 includes a through hole 111, penetrating axially through the heat sink body 11 along a center axis thereof. A core 13 made of a material with high thermal conductivity (e.g., aluminum, copper, copper alloy) is press-fitted to the through hole 111 such that residual pressure (i.e., contact pressure between the core 13 and the heat sink body 11) becomes great. In this preferred embodiment of the present invention, the core 13 is preferably made of copper. With the great contact pressure between the core 13 and the heat sink body 11, thermal resistance between the core 13 and heat sink body 11 is lowered. By virtue of this configuration, heat generated by a heat generating object (e.g., an MPU 3) is diffused to the heat sink fins 12, through the core 13 and the heat sink body 11, and then the heat is dissipated into the air. Alternatively, a concave portion may be provided at the bottom of the heat sink body 11, and the core 13 may be press-fitted to the concave portion. Alternatively, the core 13 may be integral with the heat sink body 11.

As shown in FIG. 2, the core 13 includes a heat-conducting area 131 (a bottom surface of the core 13 in this preferred embodiment of the present invention) and a fastener 14. As shown in FIG. 13B, the fastener 14 is secured to a base (e.g., a mother board 31) such that the heat sink 1 is arranged on the MPU 3, and the heat-conducting area 131 is pressed against the MPU 3 with a thermal conductive member 4 (e.g., a thermal tape or thermal conductive silicone grease) arranged therebetween such that the core 13 is thermally connected with the MPU 3. In this preferred embodiment, a base to which the fastener 14 is secured is the mother board 31. It should be noted, however, the base may be any other suitable member, such as an MPU socket or any other suitable device.

In this preferred embodiment of the present invention, the fastener 14 includes an attaching portion attached to the mother board 31 and a connecting portion at which the fastener 14 is connected to the core 13 of the heat sink 1. It should be noted, however, the fastener 14 may be connected to any other preferred portion of the heat dissipating device. Alternatively, the fastener 14 may be provided as a member completely separated from the heat dissipating device.

The thermal conductive member 4 preferably is mainly defined by a material having a high thermal conductivity. In this preferred embodiment of the present invention, the thermal conductive member 4 is a tape-shaped member (e.g., the thermal tape). The tape-shaped member is defined by a supporting base (e.g., aluminum foil, polyimide film, or fiberglass mat) and a pressure-sensitive adhesive with a filler applied on the supporting base. The thermal conductive member 4 may be a thermal-conductive-silicone grease including silicone oil and a material having a high thermal conductivity (e.g., alumina powder). With the thermal conductive member 4 being in a grease state, the thermal conductive member 4 may closely contact with both the heat-conducting area 131 and a heat spreading portion, i.e., an upper surface of the MPU 3, without gaps left therebetween. It should be noted, however, other forms of the thermal conductive member 4 may be used as long as it has a high thermal conductivity.

The heat generated by the MPU 3 is diffused to the heat sink 1 through the thermal conductive member 4 and the heat-conducting area 131. In diffusing the heat from the MPU 3 to the heat sink 1, the thermal contact resistance between the MPU 3 and the heat sink 1 (i.e., the thermal contact resistance between the thermal conductive member 4, and each of the top surface of the MPU 3 and the heat-conducting area 131 of the heat sink 1) is a critical factor for effectively dissipating the heat. By lowering the thermal contact resistance between the heat sink 1 and the MPU 3, the heat is more effectively dissipated from the MPU 3 to the heat sink 1. The thermal contact resistance is determined based on various factors, e.g., contact pressure, width of the heat-conducting area, surface roughness of the heat-conducting area, thermal conductivity of each member, thermal conductivity of the thermal conductive member 4, thickness of the thermal conductive member 4, and the hardness of each member surface. In this preferred embodiment of the present invention, the heat spreading portion and the core 13 are preferably made of a copper having a high thermal conductivity to lower the thermal contact resistance. In the present preferred embodiment of the present invention, the thermal contact resistance is further lowered by changing a form of the heat-conducting area 131 of the heat sink 1. In the following description, the form of a contacting surface of the heat-conducting area 131 according to the present preferred embodiment will be described in detail.

Figure 4:
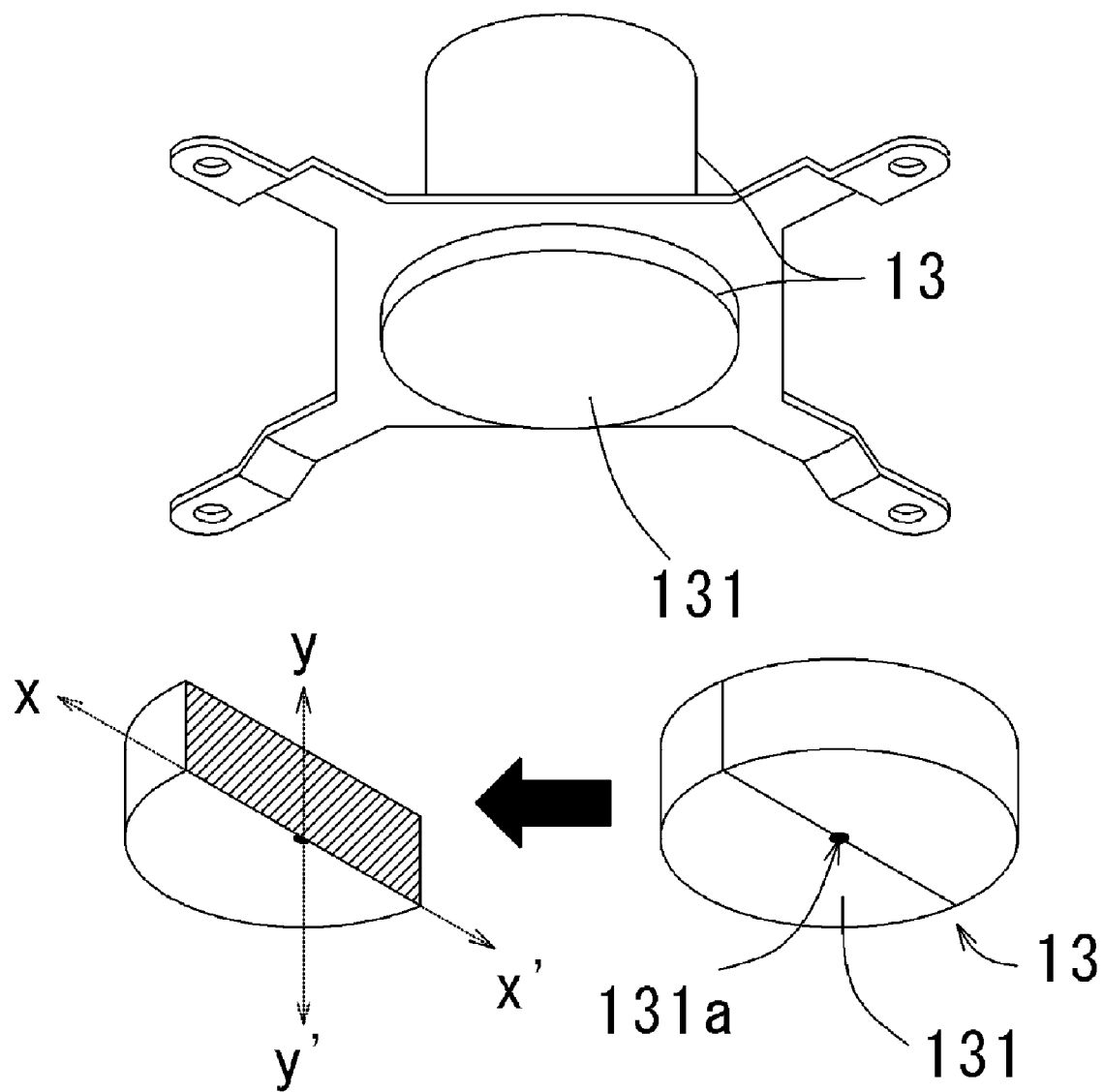
FIG. 4 illustrates a bottom portion of the core and a vertical cross section thereof along an x-x' line and a y-y' line.
Figure 5:
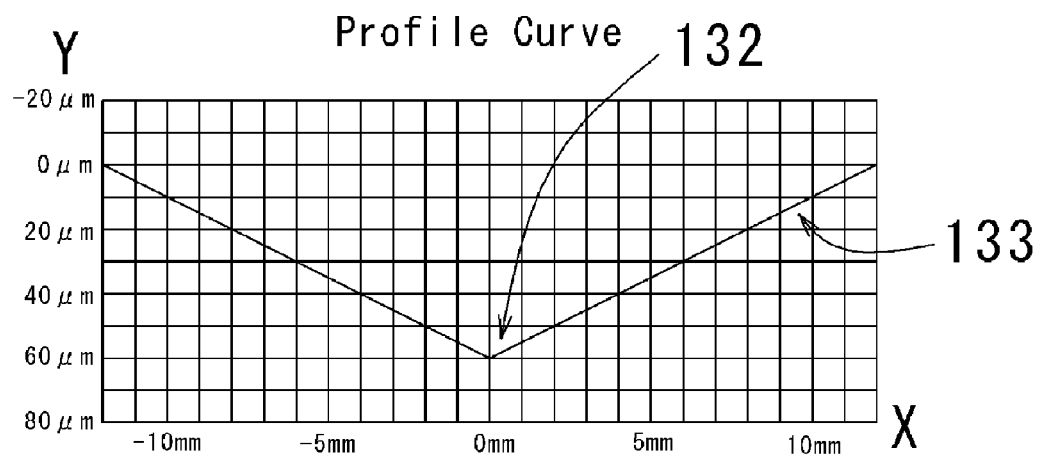
FIG. 5 illustrates a profile curve of the core according to the first preferred embodiment of the present invention.

FIG. 4 illustrates a bottom portion of the core 13 and a vertical cross section thereof, which is along a line x-x' and a line y-y'. The line x-x' is a horizontal line passing a center of the heat-conducting area 131, and the line y-y' is a vertical line passing a center of the heat-conducting area 131 as shown in FIG. 4. FIGS. 5 to 11 illustrate profile curves of various modified examples of the core 13. The core 13 is preferably made of copper and includes the heat-conducting area 131 having a substantially circular shape as shown in FIG. 4. FIG. 5 illustrates a profile curve of the core 13 along the line x-x' and the line y-y' shown in FIG. 4. The x-axis on FIG. 5 indicates a horizontal scale of the cross section (e.g., the scale along the line x-x' shown in FIG. 4), and the y-axis indicates a vertical scale of the cross section (e.g., the scale along the line y-y' shown in FIG. 4, passing the center 131*a*). The point labeled 0 mm on the x-axis represents the center 131*a* of the heat-conducting area 131. The vertical height of the peripheral portion of the heat-conducting area 131 is 0 μm.

As shown in FIG. 5, the heat-conducting area 131 according to the present preferred embodiment of the present invention protrudes vertically downwardly about 60 μm at the center 131*a* (i.e., the heat-conducting area 131 includes a tip point 132, protruding the lower most in the vertical direction, and an inclined surface 133 which inclines from the tip point 132 in a radial outer direction).

Figure 12:
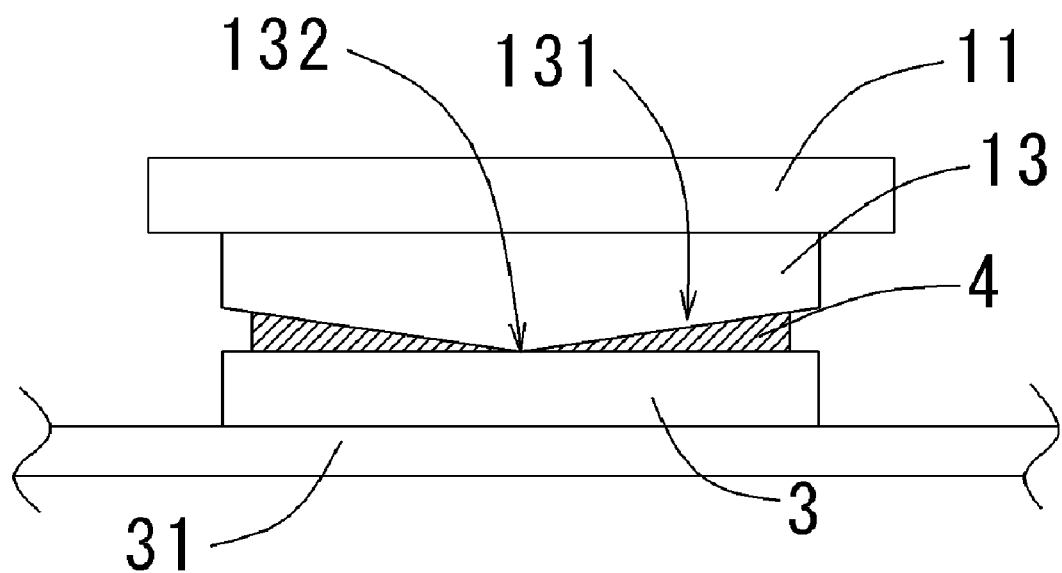
FIG. 12 illustrates the core pressed to an MPU with a thermal conductive member arranged therebetween.

FIG. 12 illustrates the core 13 pressed to the MPU 3 with the thermal conductive member 4 arranged therebetween. In FIG. 12, the vertical scale is magnified for illustrative purposes. The thermal conductive member 4 is in close contact with both the heat-conducting area 131 and the MPU 3 so that air or a gap does not remain therebetween. Since the heat-conducting area 131 has a cone shape, the vertical thickness of the thermal conductive member 4 becomes thinner below the tip point 132 when the heat sink 1 is pressed against the MPU 3. Upon further pressing the heat sink 1 against the MPU 3, the tip point 132 of the heat-conducting area 131 may come in contact with a center portion of the MPU 3. It should be noted, however, the tip point 132 may not come into contact with the MPU 3 depending on the pressure pressing the heat-conducting area 131 against the MPU 3.

The center portion of the MPU 3 generates the most heat among the portions of the MPU 3. In this preferred embodiment of the present invention, the tip point 132 of the heat-conducting area 131 comes into contact with or is arranged closely to the center portion of the MPU 3. Therefore, the thermal contact resistance between the MPU 3 and the heat-conducting area 131 is lowered, and the heat generated by the MPU 3 is effectively dissipated.

Figure 13A:
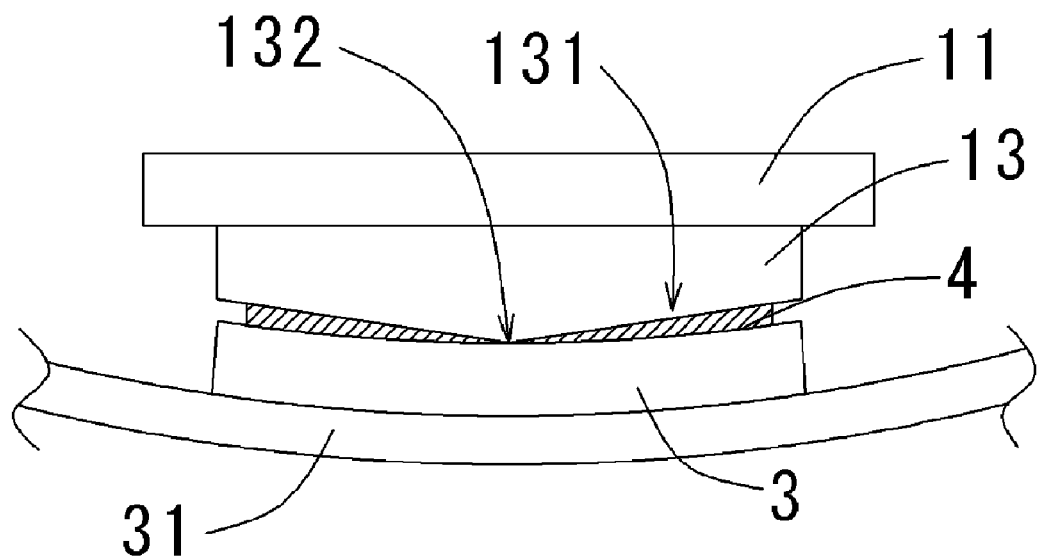
FIG. 13A is a side view illustrating the heat sink arranged on the MPU.
Figure 13B:
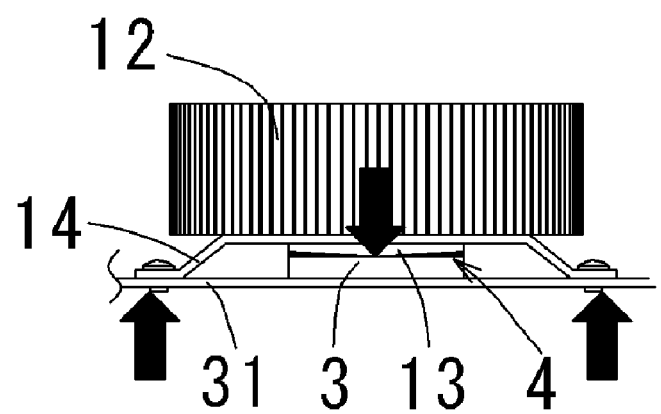
FIG. 13B is a side view illustrating the heat sink arranged on the MPU.

FIGS. 13A and 13B are side views illustrating the MPU 3 and the heat sink 1 installed on the mother board 31. The vertical scale of FIG. 13A is magnified for illustrative purposes.

During the installation of the heat sink 1, the fastener 14 is secured to the mother board 31 such that a middle portion of the heat-conducting area 131 is pressed against the MPU 3. Screws or the like are inserted into the attaching portions of the fastener 14 (e.g., mounting holes 15, as shown in FIG. 2), and are secured to the mother board 31. In the present preferred embodiment of the present invention, the connecting portion of the fastener 14 is arranged radially outside of an outer periphery of the MPU 3. In addition, when the heat sink 1 is placed on the MPU 3, the vertical height between the attaching portion and the mother board 31 is greater than that between the tip portion 132 and the MPU 3. By securing the attaching portion to the mother board 31, the tip point 132 is pressed downwardly against the MPU 3 and acts as a fulcrum. As a result, the first moment of force directed downward is generated at the middle portion of the heat-conducting area 131 and the second moment of force directed upward is generated at a portion of the fastener 14 is attached to the mother board 31. In FIG. 13B, each of the moments of force is illustrated by an arrow. Therefore, the MPU 3 and the mother board 31 are bent as shown in FIG. 13A. In this preferred embodiment of the present invention, since the heat-conducting area 131 has a cone shape, the inclined surface 133 is closely arranged along the bent heat spreading portion of the MPU 3. By virtue of this configuration, the thickness of the thermal conductive member 4 arranged between the heat sink 1 and the MPU 3 is reduced, and the thermal contact resistance therebetween is lowered as well.

Figure 19:
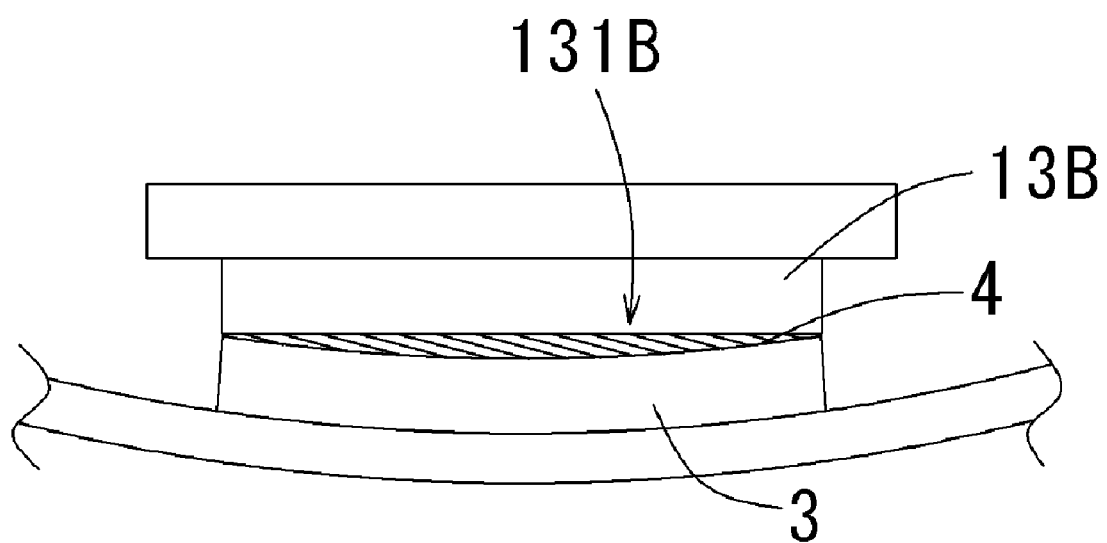
FIG. 19 illustrates a conventional heat sink with a flat heat-conducting area arranged on the MPU.

On the other hand, when a conventional heat sink having a flat heat-conducting area 131B, as shown in FIG. 19, is pressed against the MPU 3, the gap between a core 13B of the heat sink and the MPU 3 becomes a maximum below a center of the heat-conducting area 131B. Therefore, the thickness of the heat conductive member 4 becomes thicker above the center portion of the MPU 3, at which the most heat is generated among the other portions of the MPU 3. As a result, the thermal resistance between the MPU 3 and the core 13B increases and the efficiency of the heat dissipating device is degraded. In the present preferred embodiment of the present invention, since the heat-conducting area 131 of the heat sink body 11 has a protruding shape, it is possible to dissipate heat more effectively compared with the conventional heat sink.

Figure 14:
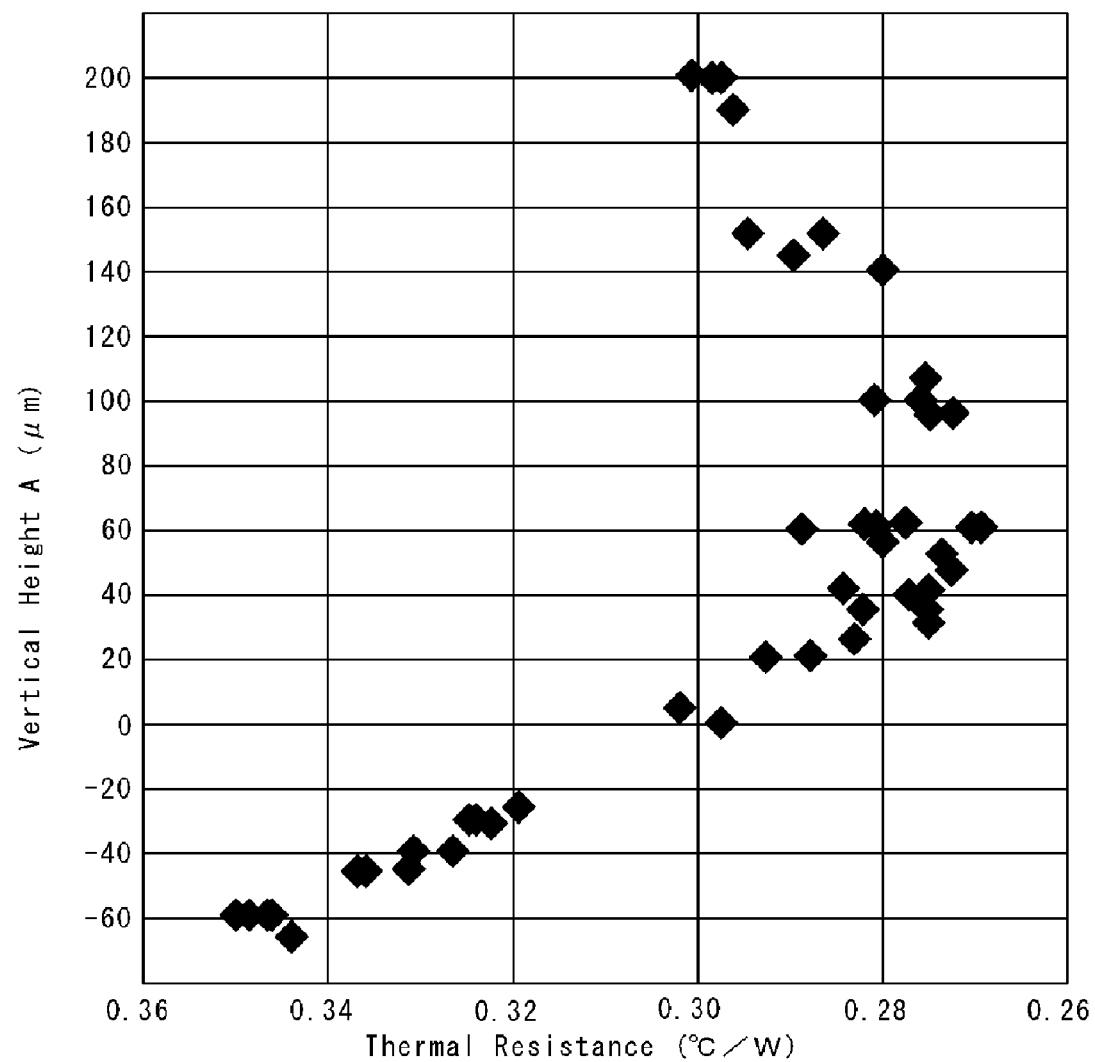
FIG. 14 is a graph describing the relationship of thermal resistance and vertical height.

FIG. 14 is a graph describing the relationship of the thermal resistance and the vertical height. When the heat-conducting area 131 is flat as shown in FIG. 19 (i.e., when the vertical height A is about 0 μm), the thermal resistance is about 0.300° C./W. When the heat-conducting area is concave (i.e., when the vertical height A ranged from about −30 μm to about −60 μm), the thermal resistance ranges from about 0.319° C./W to about 0.350° C./W. The result shows that the concave heat-conducting area less effectively dissipates heat compared with the flat heat-conducting area. With the concave heat-conducting area, the thermal conductive member 4 arranged above the center of the MPU becomes thicker, and therefore, the thermal contact resistance becomes higher.

With the convex heat-conducting area 131 (i.e., when the vertical height A ranges from about 30 μm to about 60 μm), the thermal resistance ranges from about 0.282° C./W to about 0.271° C./W. When the vertical height A ranges from about 100 μm to about 150 μm, the thermal resistance ranges from about 0.280° C./W to about 0.290° C./W. When the vertical height A ranges from about 200 μm, the thermal resistance is about 0.300° C./W, which is substantially equal to the thermal resistance when the heat-conducting area 131 is flat. Therefore, in this preferred embodiment of the present invention, the heat-conducting area 131 is formed such that the tip point 132 protrudes in the range from about 0 μm to 200 μm.

Figure 6:
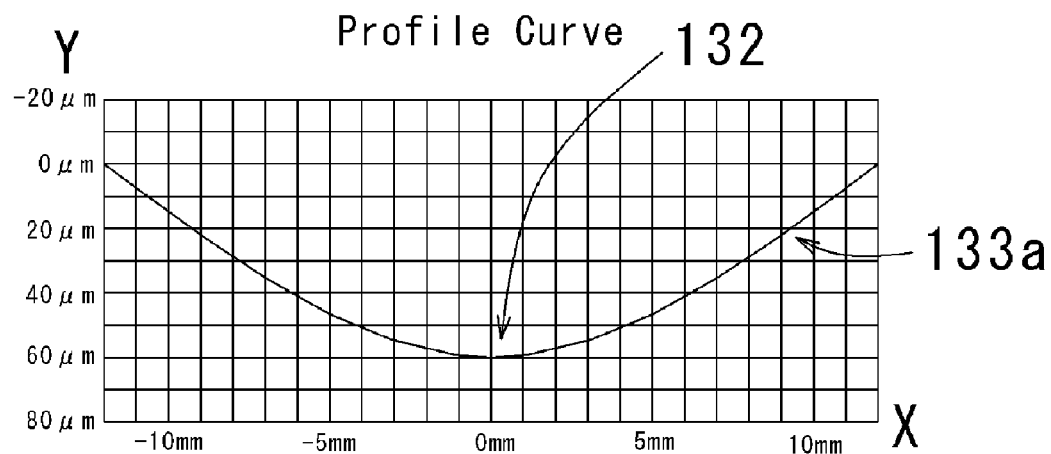
FIG. 6 illustrates a profile curve of the core according to a modified example of the first preferred embodiment of the present invention.
Figure 7:
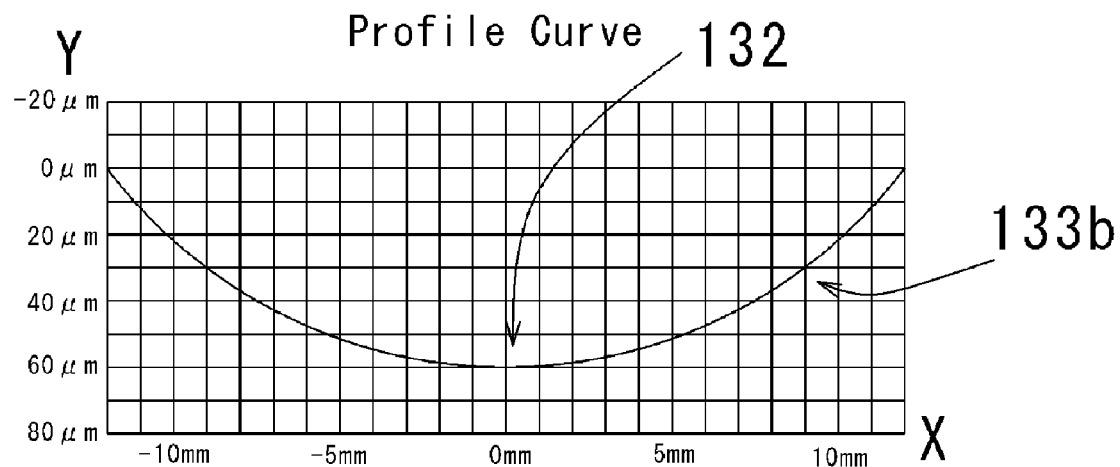
FIG. 7 illustrates a profile curve of the core according to a modified example of the first preferred embodiment of the present invention.
Figure 8:
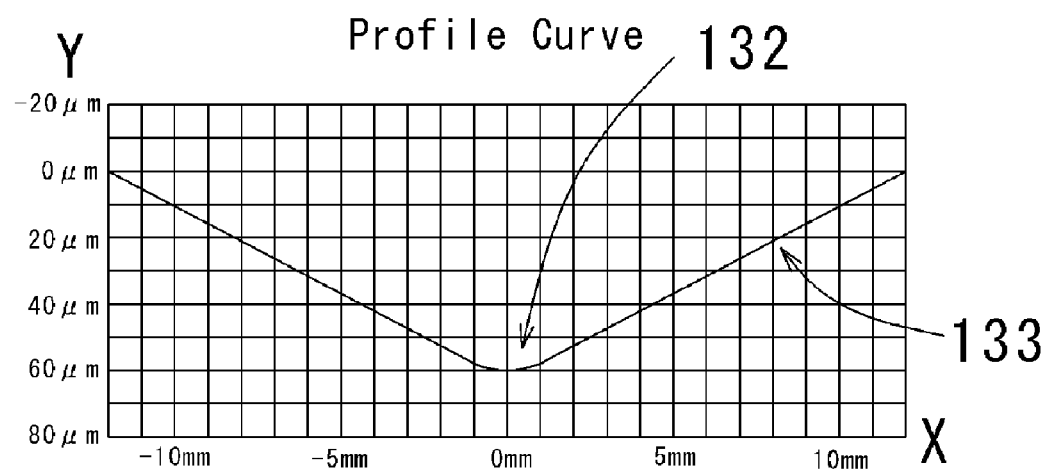
FIG. 8 illustrates a profile curve of the core according to a modified example of the first preferred embodiment of the present invention.
Figure 9:
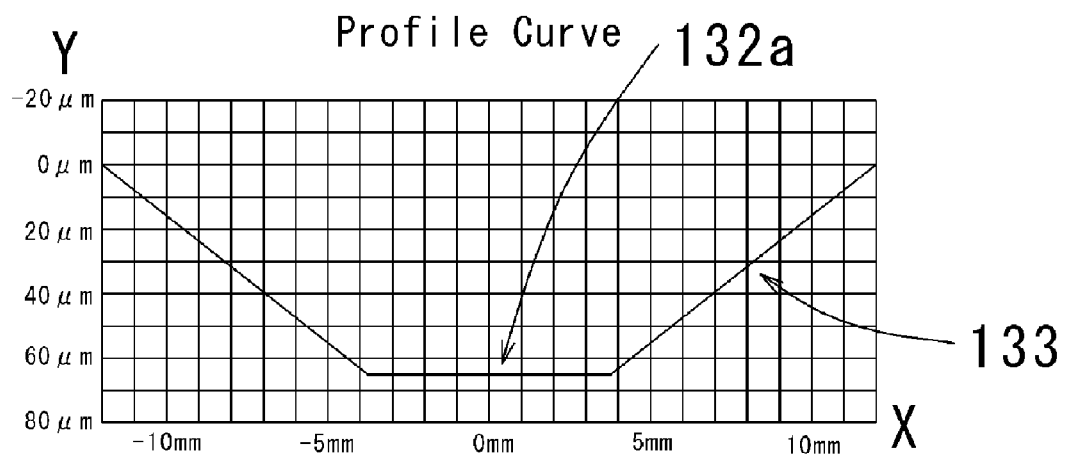
FIG. 9 illustrates a profile curve of the core according to a modified example of the first preferred embodiment of the present invention.
Figure 10:
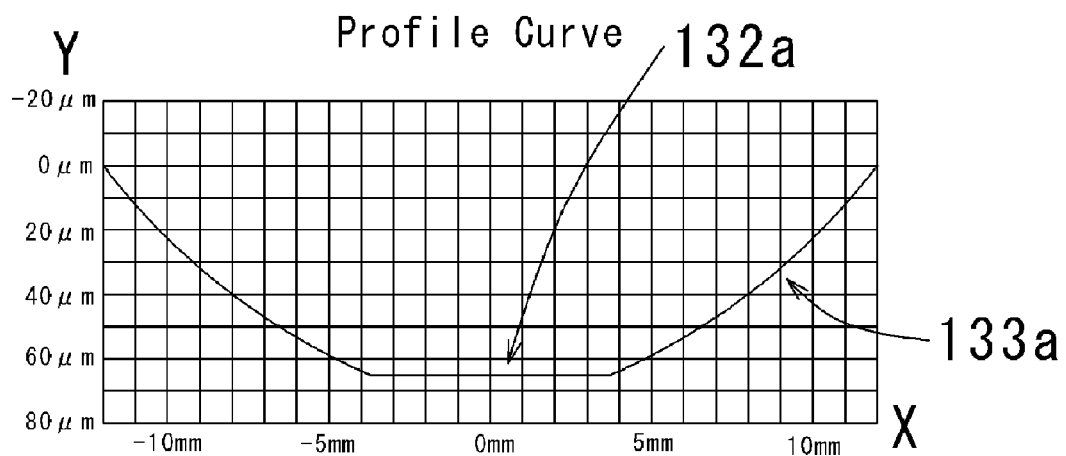
FIG. 10 illustrates a profile curve of the core according to a modified example of the first preferred embodiment of the present invention.
Figure 11:
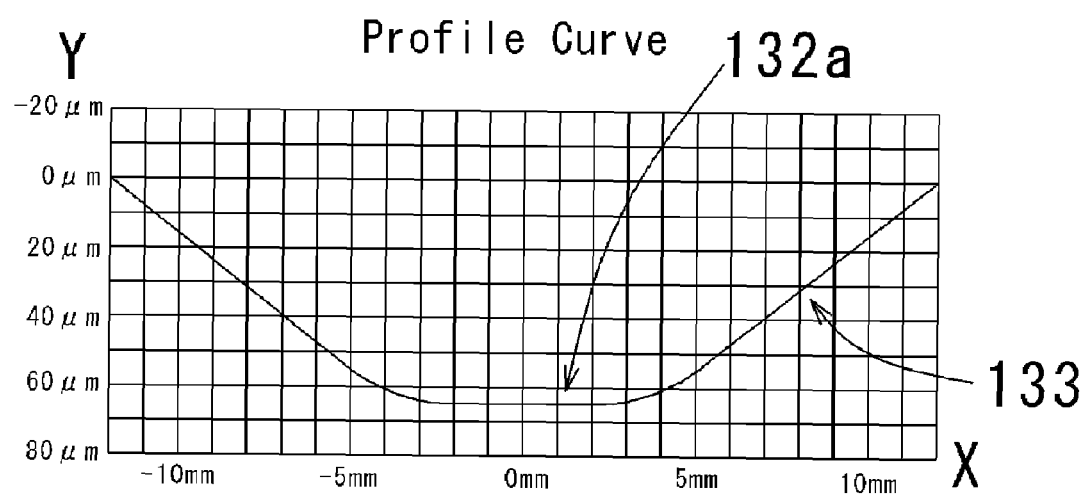
FIG. 11 illustrates a profile curve of the core according to a modified example of the first preferred embodiment of the present invention.

The shape of the heat-conducting area 131 is not limited to a cone shape as described in FIG. 5. It may be any other preferred shape such as those shown in FIGS. 6 to 11. As shown in FIGS. 6 and 7, the heat-conducting area 131 may have a curved slope 133*a*, 133*b* and the tip point 132 at the middle portion 131*a* of the heat-conducting area. As shown in FIG. 8, the heat-conducting area 131 may have the tip point 132 at the middle portion 131*a*, the inclined surface 133 downwardly inclined in the radial outward direction, and a curved edge connecting the middle portion 131a and the inclined surface 133. Instead of a tip point 132, a top surface 132a, which is arranged to be substantially parallel with a top surface of the MPU 3, may be formed on the heat-conducting area 131 as shown in FIGS. 9 to 11. As shown in FIG. 9, the heat-conducting area 131 may include a top surface 132a and the inclined surface 133 inclined downwardly outwardly. As shown in FIG. 10, the heat-conducting area 131 may include a top surface 132a and a substantially arc-shaped slope 133a inclined downwardly outwardly. As shown in FIG. 11, the heat-conducting area 131 includes a curved edge connecting the top surface 132a and the inclined surface 133. The shape of the heat-conducting area 131 is not limited to the given examples; various alterations and modifications are possible as long as it has a substantially convex shape. With a CNC (Computer Numerical Control) lathe, various kinds of modified examples of the heat-conducting area are easily formed.

Figure 15:
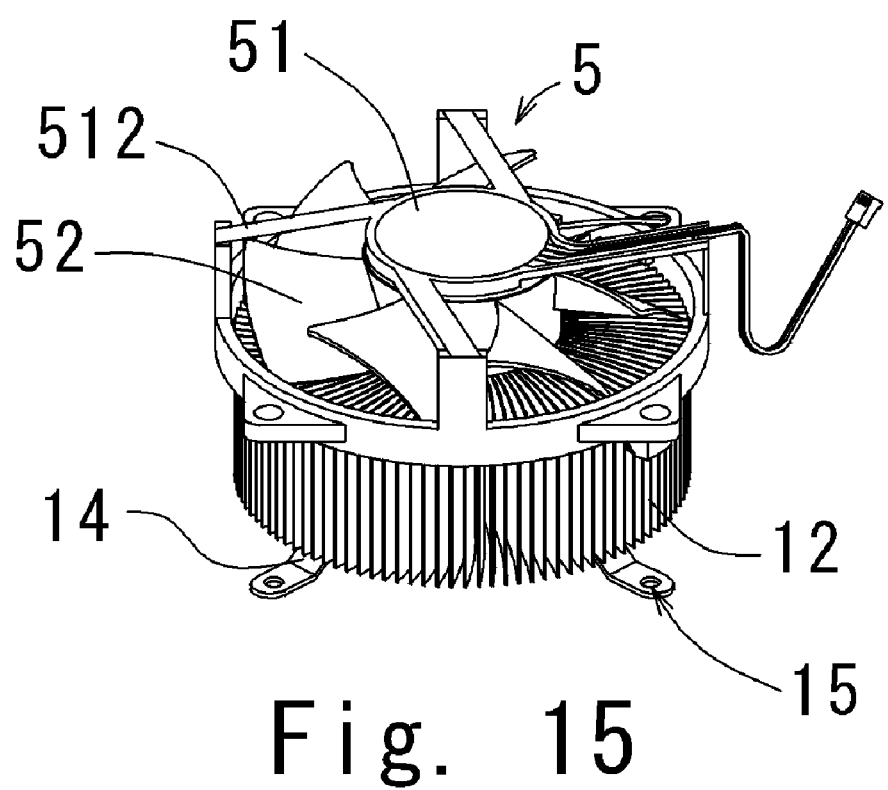
FIG. 15 is a perspective view illustrating a heat dissipating device having the heat sink and a cooling fan mounted on the heat sink.

(2) Heat Dissipating Device Having Cooling Fan Mounted on Heat Sink To Actively Dissipate Heat FIG. 15 is a perspective view illustrating the heat dissipating device having the heat sink 1 described above and a cooling fan mounted on the heat sink 1.

A cooling fan 5 includes an impeller 52 to generate air flow by rotation thereof, a motor to rotationally drive the impeller 52, a supporting portion 51 supporting the motor, and at least three spokes 512.

As shown in FIG. 15, the cooling fan 5 is arranged on the heat sink 1 in a manner that the center axis of the heat sink body 11 is concentric to a rotational axis of the impeller 52. The cooling fan 5 provides axially downwardly directed air flow to the heat sink 1. The heat generated by the MPU 3 is diffused to the heat sink 1 through the thermal conductive member 4 and the heat-conducting area 131. With the air flow generated by the cooling fan 5, the heat is actively dissipated in the air. The heat sink fins 12 may be inclined or bent along the same direction as a rotation direction of the impeller 52. By virtue of this configuration, the air effectively flows between the plurality of heat sink fins 12, and therefore, the heat is more actively dissipated in the air.

As described above, cooling characteristics of the heat dissipating device is further improved with the cooling fan 5 mounted on the heat sink 1.

Figure 16:
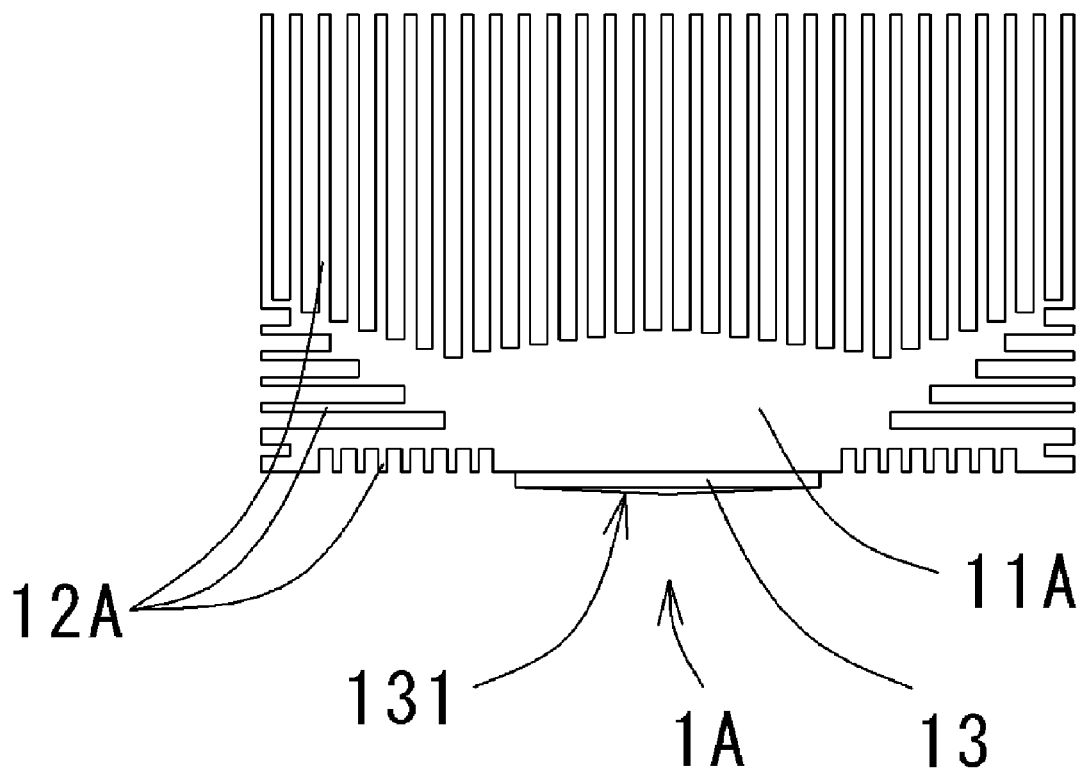
FIG. 16 is a plan view illustrating the heat sink according to a second preferred embodiment of the present invention.
Figure 17:
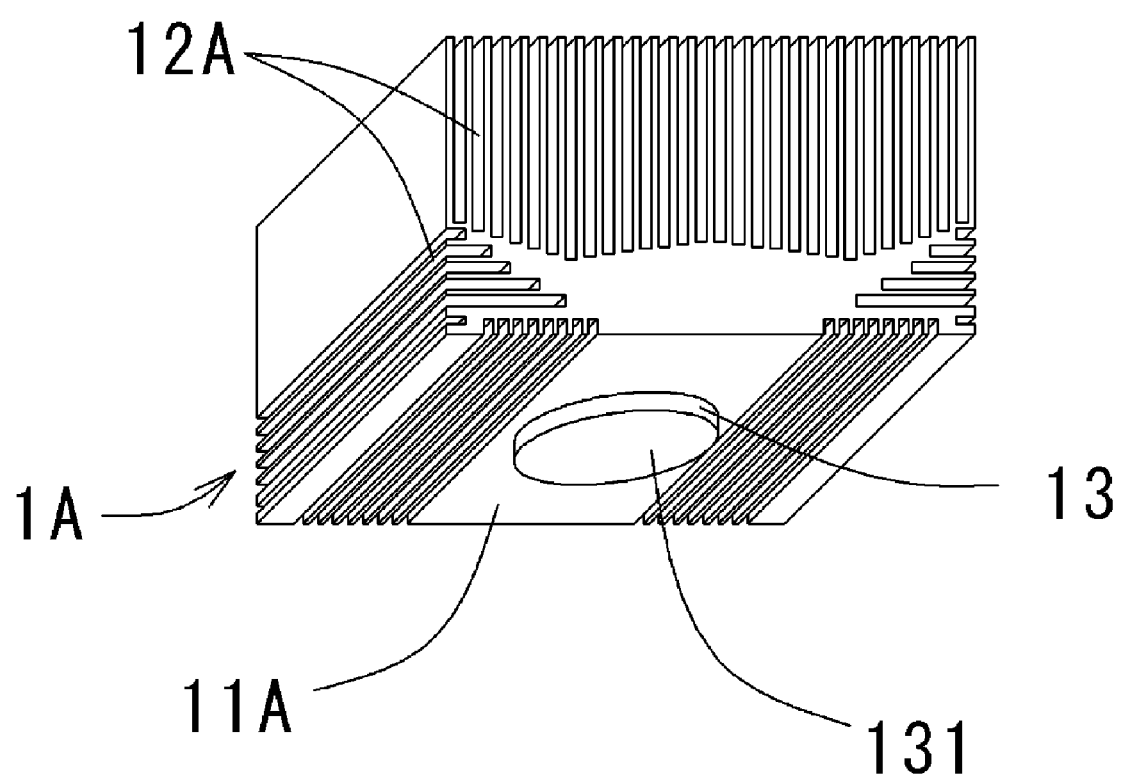
FIG. 17 is a perspective view illustrating the heat sink according to the second preferred embodiment of the present invention.

Second Preferred Embodiment (1) Heat Dissipating Device Having Heat Sink Pressed Against MPU with Thermal Conductive Member Arranged Between Heat Sink and MPU Referring to FIGS. 16 to 17, a heat sink 1A according to a second preferred embodiment of the present invention will be described. FIG. 16 is a plan view illustrating the heat sink 1A according to the second preferred embodiment of the present invention. FIG. 17 is a perspective view illustrating the heat sink 1A according to the second preferred embodiment of the present invention. The members having substantially the same functions as the counterparts of the first preferred embodiment are identified by the same reference numerals in FIGS. 16 and 17.

As shown in FIG. 16, a heat sink 1A includes a heat sink body 11A and a plurality of heat sink fins 12A protruding axially from the heat sink body 11A to widen a superficial area of heat sink 1A. The heat sink 1A is preferably made of material with a high thermal conductivity (e.g., aluminum, copper, and copper alloy). In this preferred embodiment of the present invention, the heat sink body 11A and the heat sink fins 12A are preferably made of aluminum. The heat sink fins 12A protrude axially from the heat sink body 11A in an equally spaced manner. In addition, the heat sink fins 12A may be arranged on sides of the heat sink body 11A to further increase the superficial area of the heat sink 1A.

The heat sink body 11A includes a concave portion, and the core 13 made of material with a high thermal conductivity (e.g., aluminum, copper, and copper alloy) is press-fitted to the concave portion. In this preferred embodiment of the present invention, the core 13 is preferably made of copper. The core 13 is press-fitted to the concave portion such that residual pressure (i.e., contact pressure between the core 13 and the heat sink body 11A) becomes great to lower contact thermal resistance therebetween. By virtue of this configuration, the heat generated by the MPU 3 is diffused to the heat sink fins 12A through the core 13 and the heat sink body 11A, and then the heat is dissipated into the air. Alternatively, the core 13 may be integral with the heat sink body 11A.

The core 13 includes the heat-conducting area 131. The heat-conducting area 131 protrudes axially at the middle portion thereof as described in the first preferred embodiment of the present invention. The heat-conducting area 131 is pressed against the MPU 3 with a thermal conductive member 4 (e.g., a thermal tape or thermal conductive silicone grease) arranged therebetween such that the core 13 is thermally connected with the MPU 3. When the heat sink 1A is pressed against the MPU 3, the vertical thickness of the thermal conductive member 4 becomes thinner or the heat-conducting area 131 comes into contact with the MPU 3 at the middle portion. As a result, the thermal contact resistance between the heat sink 1A and the MPU 3 is lowered, and the heat generated by the MPU 3 is effectively diffused to the heat sink 1A.

Figure 18:
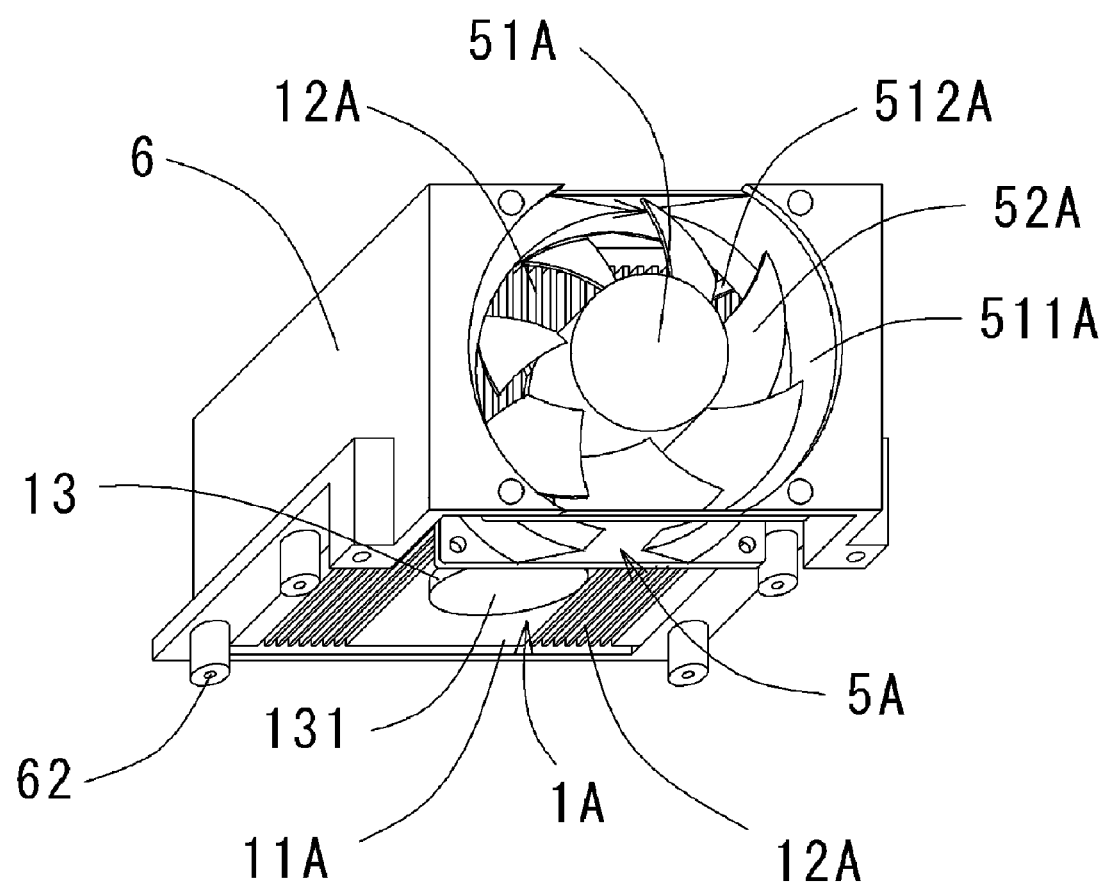
FIG. 18 is a perspective view illustrating the heat dissipating device having the heat sink and the cooling fan mounted on the heat sink.

(2) Heat Dissipating Device Having Cooling Fan Mounted on Heat Sink To Actively Dissipate Heat Referring to FIG. 18, a heat dissipating device according to the second preferred embodiment of the present invention will be described in detail. FIG. 18 is a perspective view illustrating the heat dissipating device having the heat sink 1A and the cooling fan arranged thereon.

A cooling fan 5A includes an impeller 52A to generate air flow by rotation thereof, a motor to rotationally drive the impeller 52A, a housing 511A surrounding the impeller 52A and defining a passage of air flow, a supporting portion 51A supporting the motor, and at least three spokes 512A connecting the supporting portion 51A and the housing 511A. An outer shape of the housing 511A has a substantially rectangular shape, and a mounting hole to mount the cooling fan 5A on the heat sink 1A is arranged at each of the four corners of the substantially rectangular housing 511A.

As shown in FIG. 18, the cooling fan 5A and the heat sink 1A are positioned and secured to casing 6 such that the cooling fan 5A provides air flow along the heat sink fins 12A to actively dissipate the heat. The casing 6 includes on one side surface an intake through which the cooling fan 5A intakes air, and includes on another side surface an outlet through which the air flowing along the heat sink fins 12A is discharged. The casing 6 further includes an attaching portion 62 to secure the heat dissipating device to the mother board 31. The casing 6 is secured on the mother board 31 such that the heat-conducting area 131 of the heat sink 1A is pressed to the MPU 3 with the thermal conductive member 4 arranged therebetween. With the cooling fan 5A mounted on the heat sink 1A, cooling characteristics of the heat dissipating device are further improved.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A heat dissipating device arranged to dissipate heat generated by a heat generating object mounted on a base, comprising:
   a heat sink body;
   a plurality of heat sink fins integral with the heat sink body;
   a heat-conducting area arranged to be pressed to a substantially flat surface of the heat generating object;
   a tip portion arranged approximately at a middle of the heat-conducting area and closest to the heat generating object among other areas of the heat-conducting area;
   an inclined surface of the heat-conducting area inclined outwardly from the tip portion such that a distance between the inclined surface and the heat generating object gradually increases in a state when the heat dissipating device is placed on the heat generating object; and
   a fastener including an attaching portion arranged to mount the heat dissipating device to the base, the attaching portion being arranged substantially radially outside of an outer peripheral portion of the heat generating object; wherein
   a distance between the attaching portion and the base is greater than a distance between the tip portion and the heat generating object in a state when the heat dissipating device is placed on the heat generating object such that when the heat dissipating device is mounted to the base, the base is bent.

2. The heat dissipating device as set forth in claim 1, wherein the heat-conducting area is substantially cone-shaped, and a vertex of the substantially cone-shaped heat-conducting area includes the tip portion of the heat-conducting area.

3. The heat dissipating device as set forth in claim 1, wherein a height of the tip portion from the heat-conducting area is about 200 μm or less.

4. The heat dissipating device as set forth in claim 3, further comprising a core, wherein the heat sink body includes a through hole or a concave portion, the core is attached to the through hole or the concave portion, and the heat-conducting area is arranged on the core.

5. The heat dissipating device as set forth in claim 3, wherein a thermal conductive member is arranged between the heat-conducting area and the heat generating object.

6. The heat dissipating device as set forth in claim 1, wherein the heat-conducting area has a substantially truncated cone-shape, and a truncated surface of the substantially truncated cone-shaped heat-conducting area includes the tip portion of the heat-conducting area.

7. The heat dissipating device as set forth in claim 6, wherein a height of the substantially truncated cone-shaped heat-conducting area is about 200 μm or less.

8. The heat dissipating device as set forth in claim 7, further comprising a core, wherein the heat sink body includes a through hole or a concave portion, the core is attached to the through hole or the concave portion, and the heat-conducting area is arranged on the core.

9. The heat dissipating device as set forth in claim 7, wherein a thermal conductive member is arranged between the heat-conducting area and the heat generating object.

10. The heat dissipating device as set forth in claim 1, wherein the heat-conducting area has a substantially spherical segmented-shape, and a vertex of the substantially spherical segmented-shaped heat-conducting area defines the tip portion of the heat-conducting area.

11. The heat dissipating device as set forth in claim 10, wherein a vertical height of the substantially spherical segmented-shaped heat-conducting area is about 200 μm or less.

12. The heat dissipating device as set forth in claim 11, further comprising a core, wherein the heat sink body includes a through hole or a concave portion, the core is attached to the through hole or the concave portion, and the heat-conducting area is arranged on the core.

13. The heat dissipating device as set forth in claim 11, wherein a thermal conductive member is arranged between the heat-conducting area and the heat generating object.

14. The heat dissipating device as set forth in claim 1, further comprising the base, the base being a circuit board, a socket on which the heat generating object is mounted, or a casing of an electronic device.

15. The heat dissipating device as set forth in claim 1, further comprising a cooling fan arranged to provide an air flow to the heat sink fins such that the heat diffused to the heat sink fins is actively dissipated.

16. The heat dissipating device as set forth in claim 15, further comprising a casing, wherein the casing accommodates the heat sink body, the heat sink fins, and the cooling fan.

17. The heat dissipating device as set forth in claim 16, wherein the fastener is provided as a portion of the casing.

18. The heat dissipating device as set forth in claim 1, wherein the heat-conducting area includes a cut surface shaped by a cutting process.

19. The heat dissipating device as set forth in claim 1, further comprising a core, wherein the heat sink body includes a through hole or a concave portion, the core is attached to the through hole or the concave portion, and the heat-conducting area is arranged on the core.

20. The heat dissipating device as set forth in claim 1, wherein a thermal conductive member is arranged between the heat-conducting area and the heat generating object.

21. The heat dissipating device as set forth in claim 1, wherein a vertical distance between the tip portion and a distal end portion of the heat-conducting area in the radial direction is about 200 μm or less.

* * * * *